(12) United States Patent
Byrd et al.

(10) Patent No.: US 6,809,378 B2
(45) Date of Patent: Oct. 26, 2004

(54) STRUCTURE FOR TEMPORARILY ISOLATING A DIE FROM A COMMON CONDUCTOR TO FACILITATE WAFER LEVEL TESTING

(75) Inventors: Phillip E. Byrd, Boise, ID (US); Paul R. Sharratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 191 days.

(21) Appl. No.: 09/941,761

(22) Filed: Aug. 30, 2001

(65) Prior Publication Data

US 2003/0045010 A1 Mar. 6, 2003

(51) Int. Cl.[7] .......................................... H07L 31/392
(52) U.S. Cl. ....................................................... 257/347
(58) Field of Search ............................ 438/14; 437/66; 257/347; 365/225.7

(56) References Cited

U.S. PATENT DOCUMENTS

| | | | |
|---|---|---|---|
| 5,059,899 A | 10/1991 | Farnworth et al. | |
| 5,214,657 A | 5/1993 | Farnworth et al. | |
| 5,279,975 A | 1/1994 | Devereaux et al. | |
| 5,391,892 A | 2/1995 | Devereaux et al. | |
| 5,592,007 A | * 1/1997 | Leedy | ................. 257/347 |
| 5,701,666 A | 12/1997 | DeHaven et al. | |
| 5,946,546 A | 8/1999 | Fillion et al. | |
| 6,233,184 B1 | 5/2001 | Barth et al. | |
| 6,335,891 B1 | * 1/2002 | Wilkins | ................. 365/225.7 |

* cited by examiner

*Primary Examiner*—John F Niebling
*Assistant Examiner*—Andre C Stevenson
(74) *Attorney, Agent, or Firm*—Dickstein Shapiro Morin & Oshinsky LLP (57) ABSTRACT

The invention provides an apparatus for temporarily isolating a die from other dice on a wafer commonly connected to one or more common conductors. The conductors are connected to each die through a temporary isolation device, such as a diode. The common conductor supplies a signal to all dice during one set of test procedures, while the temporary isolation device can be used to isolate a die from the common conductor during another set of test procedures.

47 Claims, 8 Drawing Sheets

STRUCTURE FOR TEMPORARILY ISOLATING A DIE FROM A COMMON CONDUCTOR TO FACILITATE WAFER LEVEL TESTING

FIELD OF THE INVENTION

This invention relates generally to the fabrication and testing of semiconductor wafers having discrete semiconductor dice. More specifically, the present invention relates to methods of temporarily isolating semiconductor dice from a common conductor during wafer level testing.

BACKGROUND OF THE INVENTION

In semiconductor manufacture, a large number of often complex electrical devices, also known as dice or integrated circuit (IC) chips, are fabricated on a semiconductor wafer. After fabrication, the dice are subjected to a series of test procedures prior to wafer dicing and packaging to assess the electrical characteristics of the circuitry of each. Dice which are determined to meet specifications are allowed to continue in the manufacturing process. Those which do not meet specifications are removed from the manufacturing process.

One series of testing is known as a "wafer level test," which applies stress conditions to the dice on the wafer in an effort to accelerate certain types of failures. Wafer level testing may involve elevated voltage, elevated temperature, elevated humidity or any other condition which a manufacturer deems appropriate to expose failures which can be detected using test equipment.

To facilitate wafer level testing, a common conductor, e.g., a buss, may be provided which interfaces a plurality of dice under test such that a signal is propagated to the plurality of dice simultaneously. One exemplary common conductor may, for example, connect individual die power inputs to a common power source, e.g., Vcc, Vss. Other common conductors may be used to supply other signals in common to the dice under test.

The use of a common conductor to supply a signal to multiple dice has its drawbacks. When a die is found to be defective, the defective die must be isolated from the common conductor(s) so that non-defective dice are not affected by electrical conditions occurring at the defective die.

One way to facilitate high reliability die isolation from a common conductor is by use of a permanent isolation device, for example a fuse. A fuse may be interposed between the common conductor and each die ensuring permanent isolation from the common conductor when the fuse is blown. While fuses and similar permanent isolation devices provide permanent isolation of a device from a common conductor, they do not permit a temporary isolation of a die from a common conductor. Thus individual die isolation and testing cannot be performed without permanently disconnecting a die from the common conductor.

SUMMARY OF THE INVENTION

The present invention provides an apparatus which facilitates temporary isolation of a die from one or more common conductors during wafer level testing. The one or more common conductors extend over a wafer and are connected to a plurality of dice on the wafers which are undergoing testing. A temporary isolation device (e.g., a diode, transistor or other element) is interposed between each die and the common conductor. The temporary isolation device can be used to isolate a die from the common conductor during wafer level testing whenever such isolation is needed.

A permanent isolation device may also be provided in the path between each die under test and the common conductor to provide permanent isolation whenever permanent isolation is needed.

BRIEF DESCRIPTION OF THE DRAWINGS

These and other aspects and features of the invention will be better understood from the following detailed description which is provided with the accompanying drawings.

DETAILED DESCRIPTION OF THE INVENTION

The invention provides the capability to perform wafer level testing while temporarily isolating a die for testing from other dice which are otherwise in electrical communication with a common conductor. In the invention, at least one temporary isolation device is provided between each die and a common conductor to temporarily electrically isolate the die from the common conductor. The temporary isolation device may be a diode, transistor or other element. When a diode is used it can be reverse biased such that the individual die is isolated from the common conductor. The invention also provides a temporary isolation testing system and procedure which is compatible with conventional test equipment already in use.

Temporary isolation of each unsingulated die on the wafer from the common buss can be performed with the invention, such that it may be determined if an individual die meets the required specifications that allow the die to continue in the manufacturing process. If a die is deemed to not meet the required specifications during this temporary isolation, it may be subjected to repair or permanent isolation from the common conductor.

To simplify discussion, a fuse will be described as one exemplary form of a permanent isolation device which can be employed in the invention, and a diode will be described as one exemplary form of a temporary isolation device. However, it must be understood that any one of a variety of devices may be used as a permanent and temporary isolation devices and thus the invention is not limited to fuses or diodes to accomplish the permanent and/or temporary isolation functions. Non-limiting examples of other permanent isolation devices include several electrical connections or other electrical circuits or devices which permanently isolate a die from a common conductor. Non-limiting examples of other temporary isolation devices include transistors, or other electrical circuits or devices which can temporarily isolate a die from a common conductor.

Also, for simplicity, a common conductor will be discussed below as one or more power supply conductors; however, the common conductor can be used to supply any signal to plural dice connected to it.

Figure 1A:
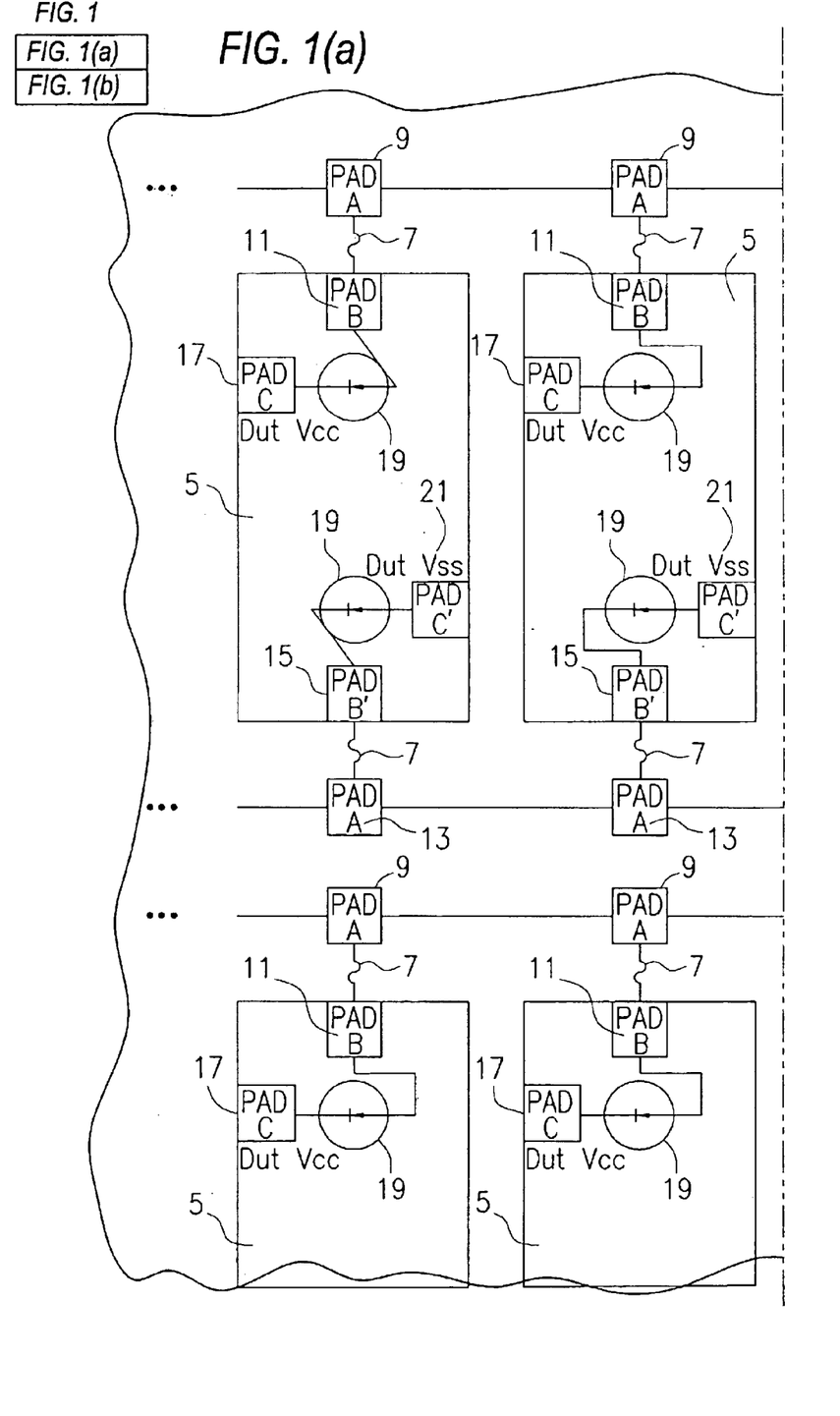
FIG. 1 shows a simplified schematic diagram of a portion of a semiconductor wafer constructed in accordance with an exemplary embodiment of the invention.
Figure 1B:
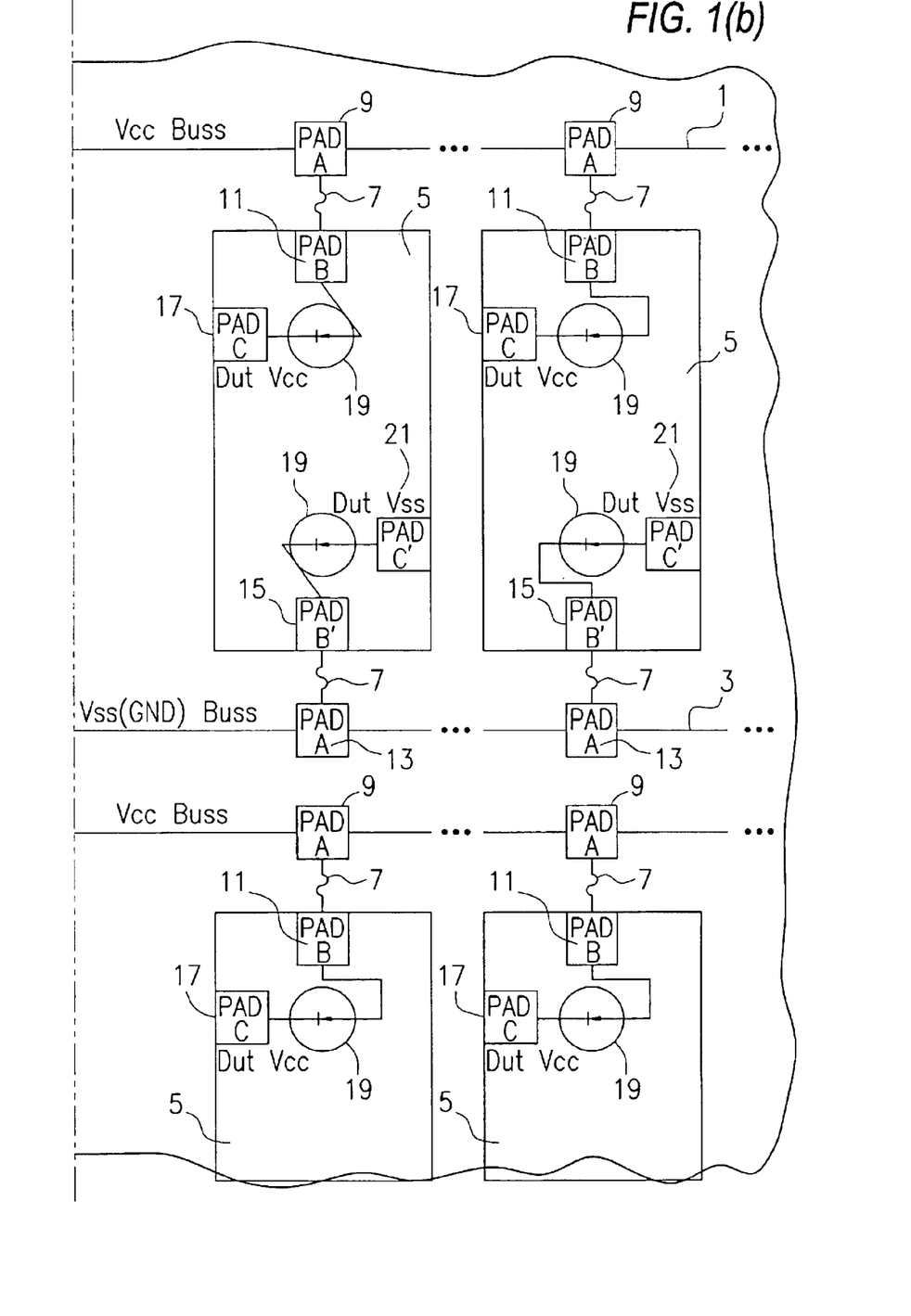

The invention will now be explained with reference to FIGS. 1–10. FIG. 1 discloses one exemplary embodiment of the invention. A portion of a wafer is shown as containing a plurality of dice 5 which are to be tested before die singulation. A common conductor 1 is provided on the wafer and is used to supply a first signal, for example, a positive Vcc voltage, to the individual dice. Likewise, a common conductor 3 is provided on the wafer and is used to supply a second signal, for example, a Vss voltage (ground), to the individual dice.

The common conductors 1 and 3 may supply any signals necessary for die operation or testing and thus, as noted, are not limited to supplying first and second voltage signals, e.g. Vcc and Vss. The common conductor may be a single conductor or may be part of a group of common conductors which provide signals to the dice 5.

A plurality of probe pads 9 are provided in direct electrical communication with the common conductor 1, each in proximity to a die 5 on the wafer. A probe pad 11 is provided on each die 5 on the wafer in proximity to a probe pad 9 on the wafer. A permanent isolation device 7 (e.g. fuse) may be interposed between the common buss 1 and a probe pad 11. A probe pad 17 is provided on each die 5 and is connected to, for example, the normal Vcc voltage input terminal of the die. A temporary isolation device 19, e.g., diode, is provided on each die 5 between each probe pad 17 and probe pad 11. The diode 19 is installed such that it is operative in a forward bias manner during wafer level testing allowing a signal to pass from common conductor 1 to probe pad 11 and to probe pad 17. When temporary isolation is needed, the diode is reverse biased thereby isolating the die from the common conductor 1.

A plurality of probe pads 13 are provided in direct electrical communication to another common conductor 3 each in proximity to a die 5 on the wafer. A probe pad 15 resides on each die 5 in proximity to the closest probe pad 13 on the wafer. A permanent isolation device 7 (e.g. fuse) may be interposed between each probe pad 13 and a probe pad 15. A probe pad 21 is provided on each die 5 and is connected to, for example, the normal Vss voltage input terminal of the die. A temporary isolation device 19 (e.g. diode) is installed on the die 5 between each probe pad 21 and probe pad 15. The diode 19 is installed such that it is operative in a forward bias manner during wafer level testing allowing a signal to pass between probe pad 21 and probe pad 15. When temporary isolation is needed, the diode 19 is reverse biased thereby isolating the die 5 from the common conductor 3. It should be recognized that while FIG. 1 shows a permanent isolation device 7 (e.g. fuse) and a temporary isolation device 19 (e.g. diode) interposed between each common conductor and the die, it may be desirable to also have some common conductors which are connected directly to the dice 5 without interposed permanent or temporary isolation devices. Also, although FIG. 1 shows the permanent isolation devices 7 fabricated on the wafer off the dice 5 and the temporary isolation devices 19 fabricated on the dice, it is possible to fabricate both off the dice 5 or both on the dice 5, or with the temporary isolation device 19 off the dice 5 and the permanent isolation device 7 on the dice. It is also possible to provide the common conductor on an external interface, e.g. a test head or a probe card, and provide one or both of the permanent isolation device 7 and temporary isolation device 19 on the external interface.

As can be seen in FIG. 1, when the diodes 19 between pads 11 and 17 and pads 21 and 15 are reverse biased during probe testing procedures of an individual die, only a small amount of leakage will be observed passing to the common wafer conductors 1 and 3 through the permanent isolation device, e.g. fuse 7. Accordingly, each die may be individually tested with a first and second signal, e.g. Vcc and Vss respectively provided through probe pads 17 and 21, without affecting other dice connected to the common conductors 1 and 3. If during such individual testing a die is found to be defective, the permanent isolation device 7 associated with the defective die may be used by means well known in the art (e.g. fuse blowing) to permanently isolate the die from the common conductors 1 and 3 thereby enabling the common conductors to effectively power the serviceable dice during wafer level testing procedures.

FIG. 1 shows the permanent isolation device 7, e.g., fuse, provided on a wafer and off the dice 5 and between pads 9 and 11 and between pads 13 and 15. However, as noted, the permanent isolation device can be provided at other locations, including on each die 5, or on an external interface, between a common conductor 1 and a die signal pad on the die requiring a signal from the common conductor. Moreover, the temporary isolation devices 19, e.g., diodes, may be directly connected to a respective common conductor, e.g. 1, 3 with the permanent isolation devices being connected between the temporary isolation devices and die.

Figure 2:
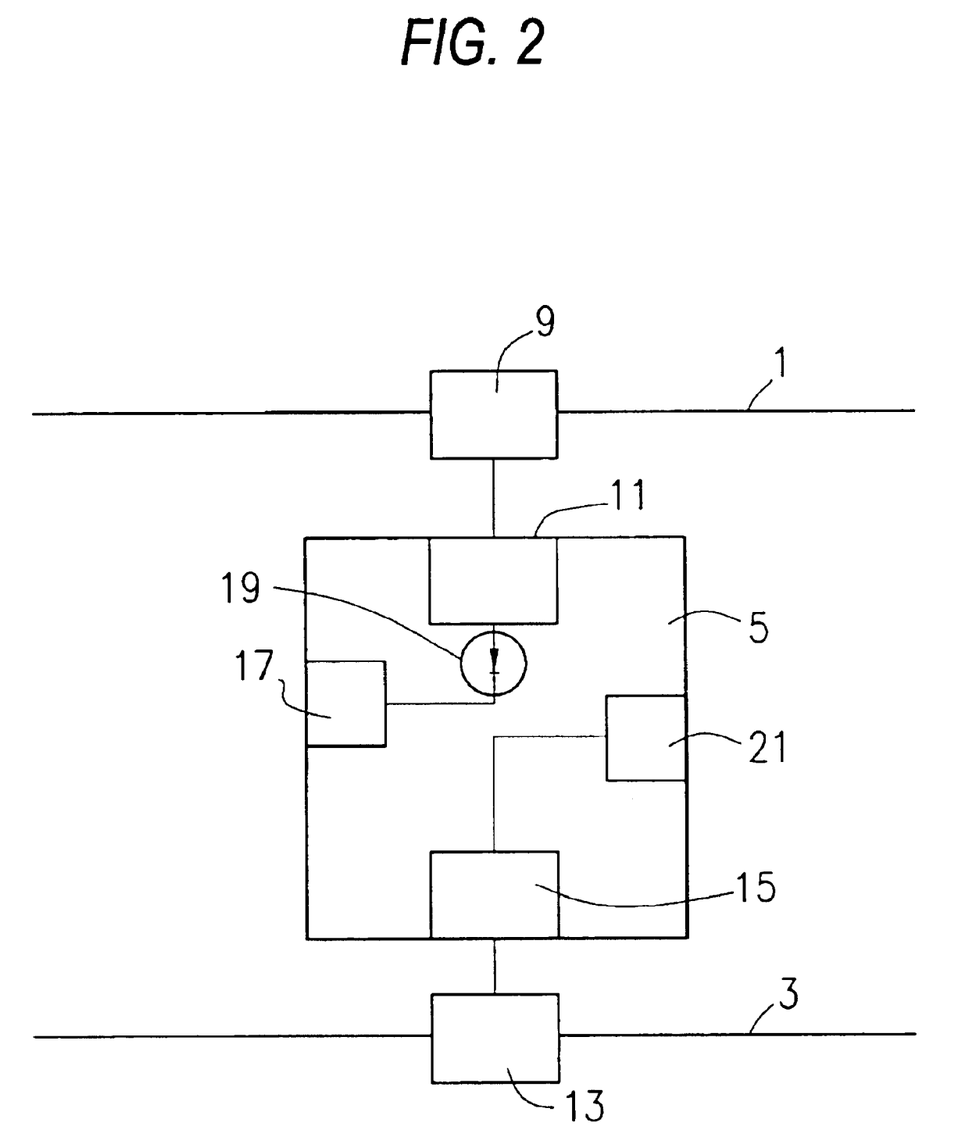
FIG. 2 shows a simplified schematic diagram of a portion of a semiconductor wafer constructed in accordance with a modified embodiment of the invention.

For example, FIG. 2 shows one alternative embodiment of the invention where the temporary isolation device 19, e.g. diode, between pads 15 and 21 is omitted. FIG. 2 also shows omission of the permanent isolation devices 7, e.g. fuse, between pads 9 and 11 and 13 and 15. Other modified embodiments are described below with reference to FIGS. 4–11.

Figure 3:
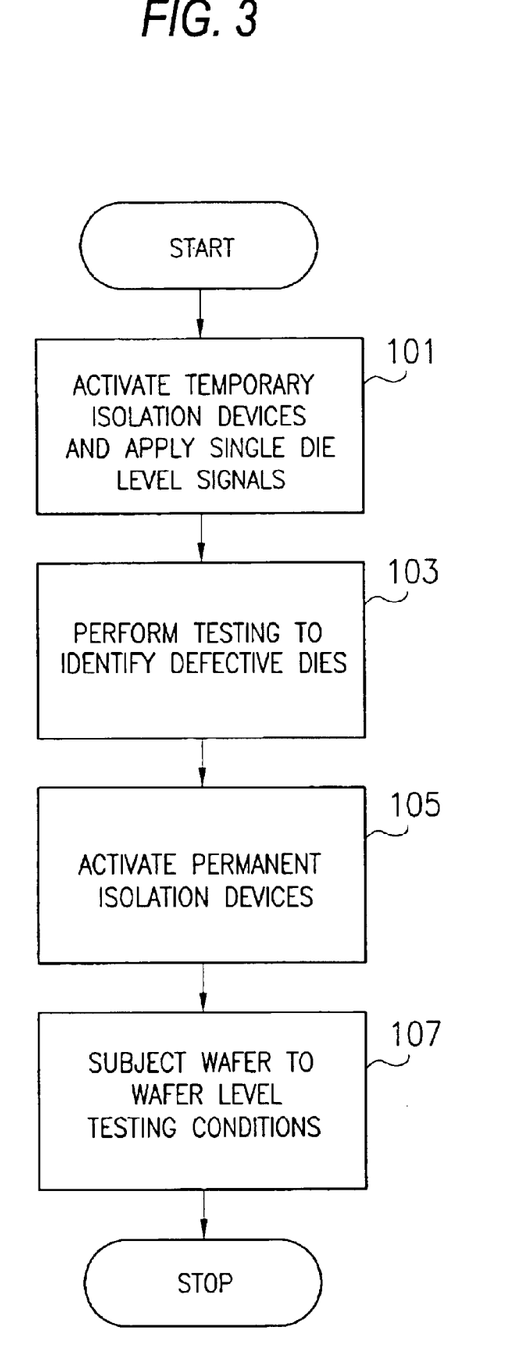
FIG. 3 shows a simplified process sequence for isolating and testing dice using the FIG. 1 or FIG. 2 embodiment of the invention.

FIG. 3 shows a simplified processing sequence used for testing each die 5 in FIG. 1. First, in processing segment 101, single die level signals are applied from an external interface to the pads 17 and 11 and 21 and 15 to supply signals to the temporary isolation device(s). Other probes of the external interface may be applied to other signal pads of each die 5 during testing. This reverse biases the diodes used as temporary isolation devices 19, thereby isolating a die 5 from the common conductors 1 and 3. In processing segment 103, testing of an isolated die 5 is performed. If the testing reveals that a die 5 should be permanently isolated, then in processing segment 105, the permanent isolation devices 7 are activated, e.g., fuses blown, to permanently isolate defective dice 5 from the common conductors 1, 3. As shown in processing sequence 107, when the wafer is subjected to wafer level testing conditions, including, for example, wafer level burn-in, signals are applied to conductors 1, 3 which during operation forward bias the diodes 19, permitting common conductors to supply desired signals to all dies still connected to the common conductors. Tests are then conducted with all dice 5 receiving common signals from the common conductors.

The processing sequence of FIG. 3 may be varied from that shown to perform testing or other operations which require temporary isolation of dice 5 from one or more common conductors. For example, die isolation and individual die testing using the FIG. 1 embodiment, may be accomplished after signals are commonly applied to all dice through the common conductors 1 and 3 (segment 107). The permanent isolation devices 7, e.g. fuses, can be opened, e.g. fuses blown, either automatically or manually when defective dice are identified when signals are applied to conductors 1, 3. The permanent isolation devices may also be opened when signals are applied directly to the die pads 17 and 21 and defective device dice 5 are found. Permanent isolation devices 7, such as fuses, may be activated by use of any technology which is appropriate for providing permanent isolation of dice from a common conductor. When fuses are used, the fuse itself can be automatically blown when excessive current passes through it, or it can be opened by laser, mechanical severance, applying a sufficient high voltage across it, or other technique.

Figure 4:
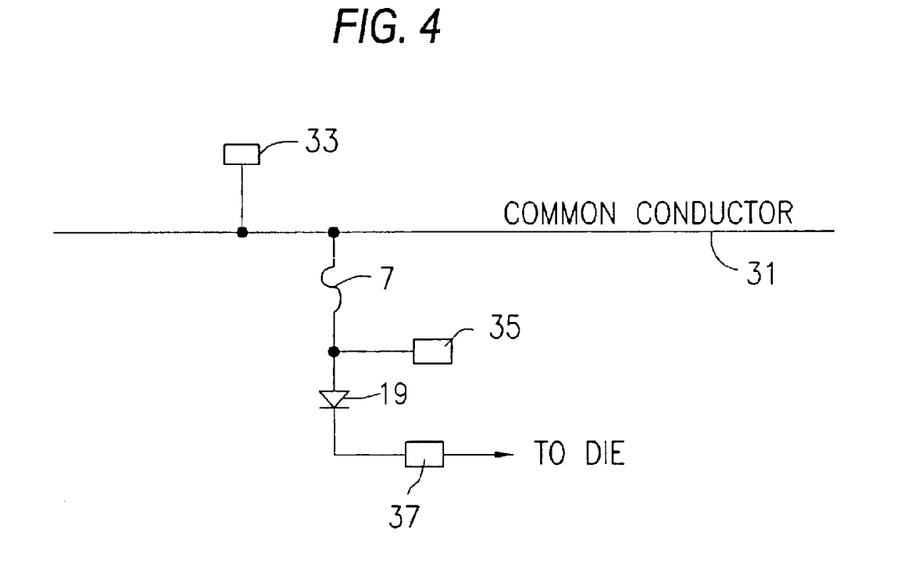
FIG. 4 shows a simplified schematic diagram of a portion of a semiconductor wafer constructed in accordance with another modified embodiment of the invention.

FIGS. 4 through 11 illustrate other alternative embodiments of the invention. FIG. 4 illustrates an embodiment where the permanent isolation device 7, e.g. a fuse, and a temporary isolation device 19, e.g., a diode, are provided on a wafer between a common conductor 31 and a die 5. Probe pads 33, 35 and 37 are also shown. In this embodiment, both the permanent 7 and temporary 19 isolation devices are provided off die, for example, in the street area of a wafer.

Figure 5:
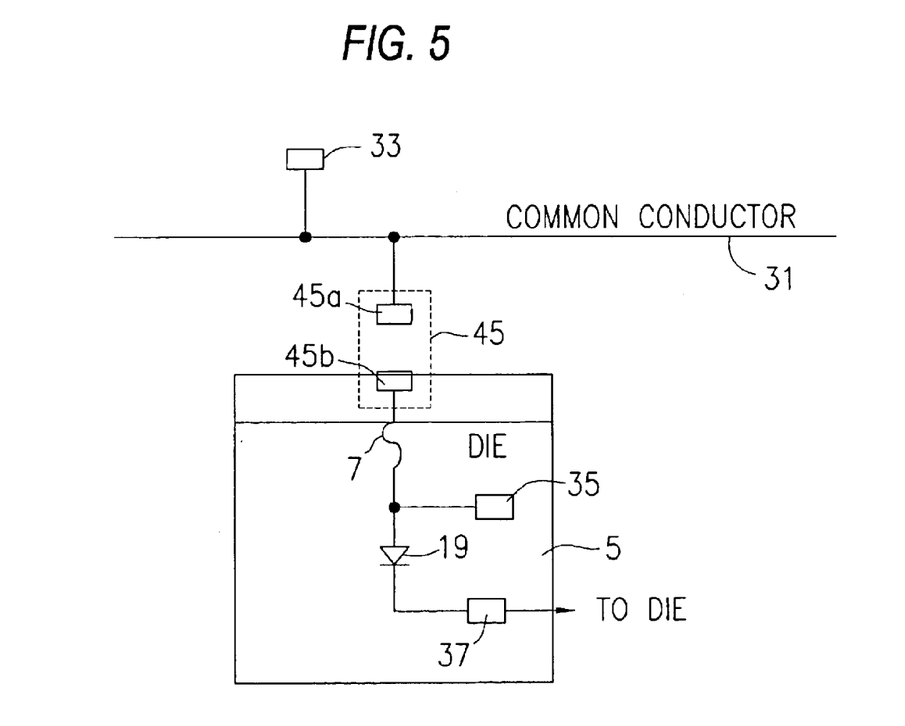
FIG. 5 shows a simplified schematic diagram of a portion of a semiconductor wafer constructed in accordance with another modified embodiment of the invention.

FIG. 5 illustrates an embodiment where the permanent isolation device 7, e.g. fuse, and temporary isolation device 19, e.g. diode, are provided on a die 5, and a pair of spaced probe pads 45a, 45b are used which can be bridged by a conductor on an external interface to connect die 5 to common conductor 31. Pad 45b is provided on the die while pad 45a is provided off the die 5.

Figure 6:
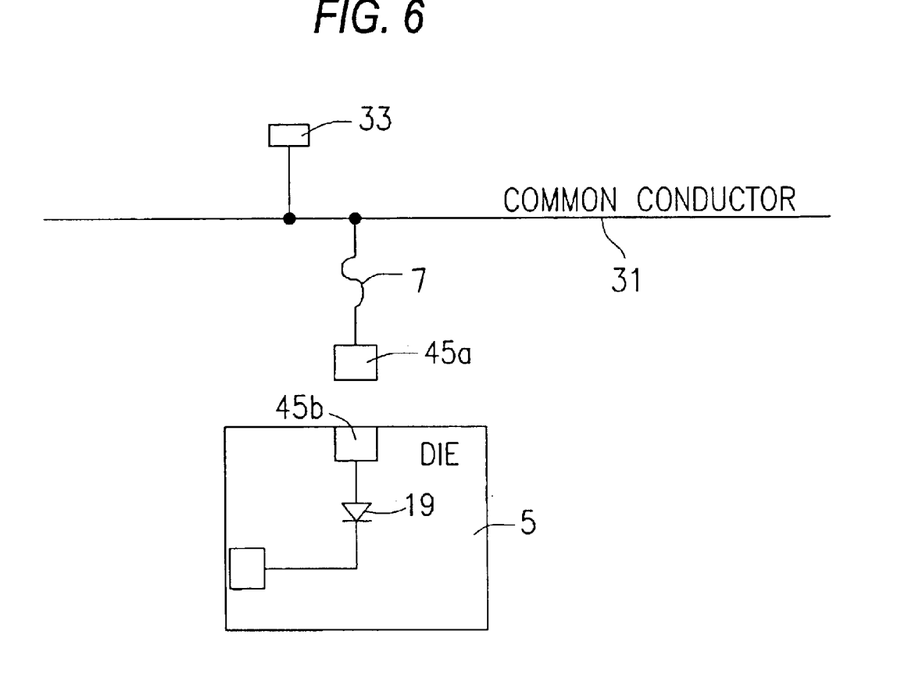
FIG. 6 shows a simplified schematic diagram of a portion of a semiconductor wafer constructed in accordance with another modified embodiment of the invention.

FIG. 6 illustrates an embodiment of the invention in which the permanent isolation device 7, e.g. a fuse, is provided off the die, the temporary isolation device 19, e.g. a diode, is provided on the die and spaced pads 45a, 45b which can be bridged by a conductor on an external interface and which are used to connect die 5 to the common conductor 31.

Figure 7:
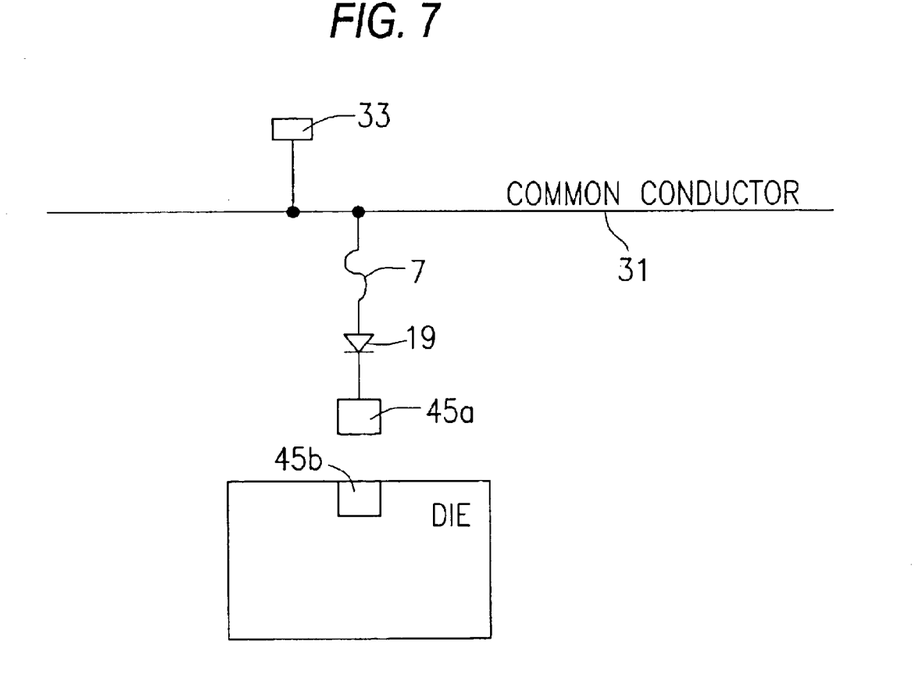
FIG. 7 shows a simplified schematic diagram of a portion of a semiconductor wafer constructed in accordance with another modified embodiment of the invention.

FIG. 7 illustrates an embodiment of the invention in which both the permanent isolation device 7, e.g. fuse, and the temporary isolation device 19, e.g. diode, are provided off the die 5 and a pair of spaced pads 45a, 45b which can be bridged with a conductor on an external interface which are used to connect die 5 to the common conductor 31. Here pad 45a is provided off die 5, while pad 45b is provided on the die 5.

Figure 8:
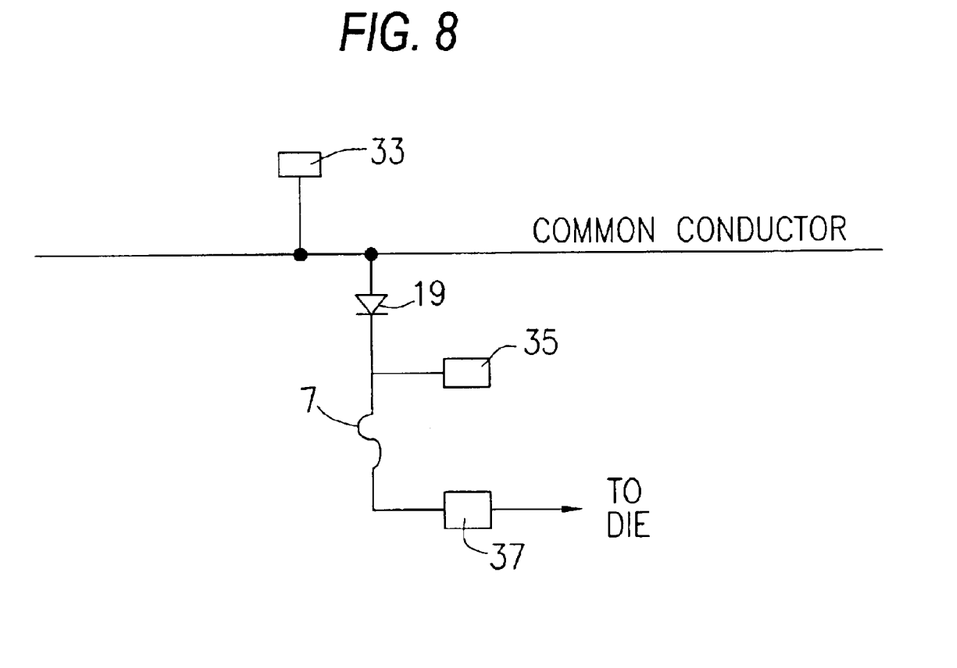
FIG. 8 shows a simplified schematic diagram of a portion of a semiconductor wafer constructed in accordance with another modified embodiment of the invention.

FIG. 8 illustrates an embodiment of the invention similar to FIG. 4, but where the locations of the permanent and temporary isolation devices 7, 19 are reversed.

Figure 9:
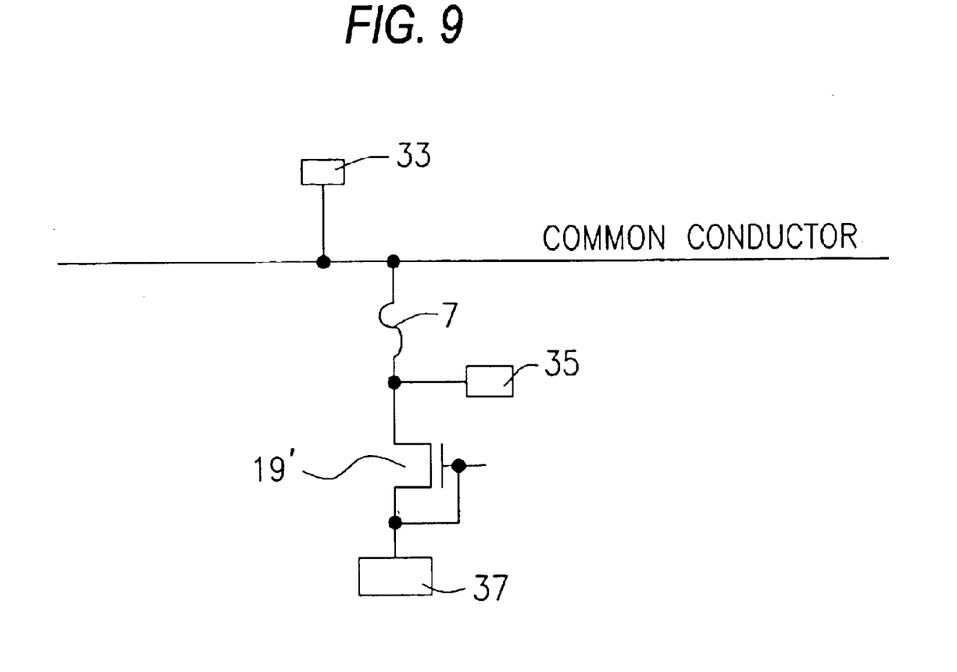
FIG. 9 shows a simplified schematic diagram of a portion of a semiconductor wafer constructed in accordance with another modified embodiment of the invention.
Figure 10:
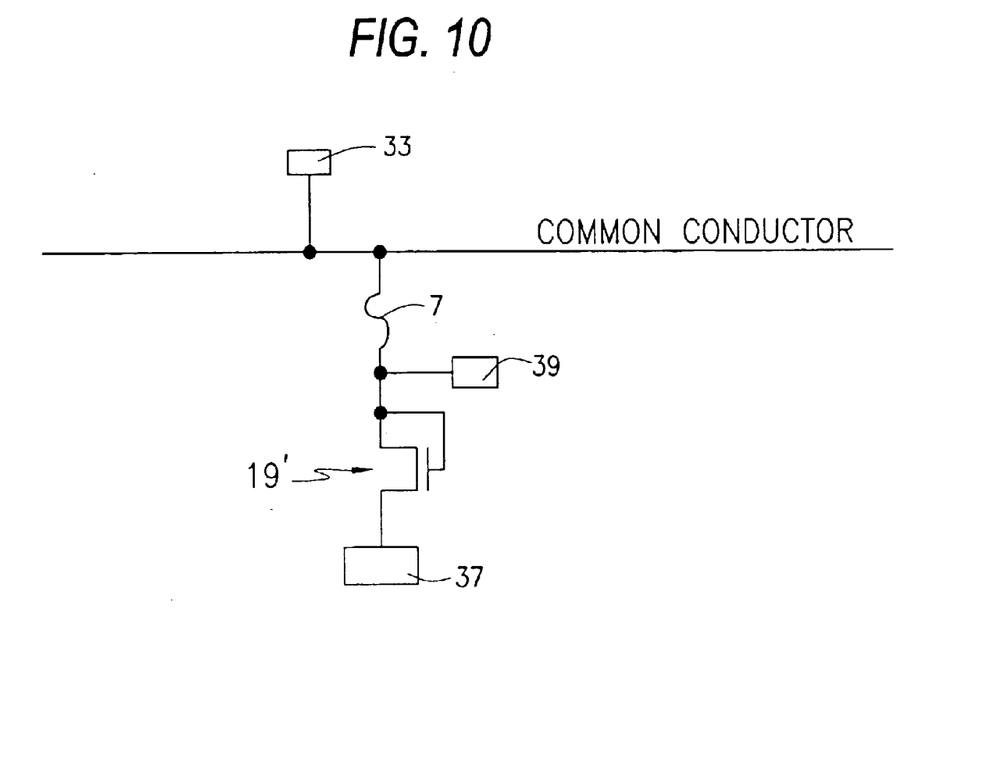
FIG. 10 shows a simplified schematic diagram of a portion of a semiconductor wafer constructed in accordance with another modified embodiment of the invention.

FIGS. 9 and 10 illustrate embodiments similar to FIG. 4, but were the temporary isolation device 19' is shown as a transistor connected as a diode. FIGS. 9 and 10 differ in the type of transistor and associated connections which make it function as a diode.

Figure 11:
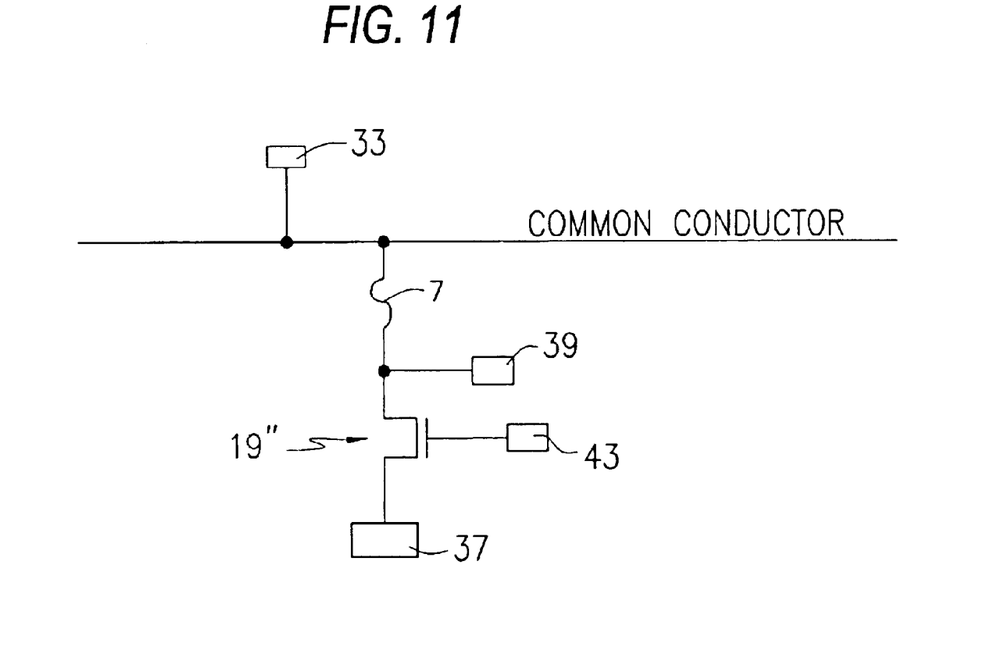
FIG. 11 shows a simplified schematic diagram of a portion of a semiconductor wafer constructed in accordance with another modified embodiment of the invention.

FIG. 11 illustrates an embodiment similar to FIG. 4, but where the temporary isolation device 19" is a controlled transistor with the control signal being supplied via a probe pad 43. The applied control signal may originate at an external interface.

While the invention has been described and illustrated with respect to one or more common conductors, e.g. 1, 3, 31, which are provided on a wafer, the common conductors can instead be provided on an external interface used during wafer level testing.

Also, during temporary isolation, individual dice 5 may be tested in a predefined order or simultaneously.

While exemplary embodiments of the invention have been described and illustrated, it should be evident that many alterations, modifications and variations can be made without departing from the spirit or scope of the invention. Accordingly, the invention is not to be considered as limited by the descriptions and illustrations provided, but is only limited by the scope of the appended claims.

What is claimed is:

1. A die test apparatus comprising:
   a plurality of dice fabricated on a wafer
   a common signal line for applying a signal in common to said plurality of dice; and
   a plurality of temporary isolation devices respectively provided between said common signal line and said plurality of dice, each said temporary isolation device permitting an associated die to be temporarily disconnected from said common signal line.

2. An apparatus of claim 1 wherein said temporary isolation device is a unidirectional current device.

3. An apparatus of claim 2 wherein said temporary isolation device is a diode.

4. An apparatus of claim 2 wherein said temporary isolation device is a transistor.

5. An apparatus of claim 4 wherein said transistor is connected as a diode.

6. An apparatus of claim 4 wherein said transistor is connected to be controlled by an applied signal.

7. An apparatus of claim 1 wherein said common signal line supplies a power supply signal to said dice.

8. An apparatus of claim 1, further comprising a plurality of permanent isolation devices respectively provided in series with said plurality of temporary isolation devices, each said permanent isolation device being capable of providing permanent isolation between said common signal line and a respective die.

9. An apparatus of claim 8, wherein each said permanent isolation devices comprises a fuse.

10. An apparatus of claim 1 wherein said common signal line is provided on said wafer.

11. An apparatus of claim 1 further comprising an external interface for testing said plurality of dies and wherein said common signal line is provided on said external interface.

12. An apparatus of claim 1 wherein each said temporary isolation device is provided off an associated die.

13. An apparatus of claim 12 wherein each said temporary isolation device is provided on said wafer.

14. An apparatus of claim 13 wherein each said temporary isolation device is provided in a street area of said wafer.

15. An apparatus of claim 12 wherein each said temporary isolation device is provided at an external interface for testing said plurality of dies.

16. An apparatus of claim 1 wherein each temporary isolation device is provided on a respective die.

17. An apparatus of claim 8 wherein each said permanent isolation device is provided off a respective die.

18. An apparatus of claim 17 each said permanent isolation device is provided on said wafer.

19. An apparatus of claim 18 each said permanent isolation device is provided in a street area of said wafer.

20. An apparatus of claim 17 where each said permanent isolation device is provided at an external interface for testing said plurality of dies.

21. An apparatus of claim 8, wherein each permanent isolation device is provided on a respective die.

22. An apparatus of claim 1 further comprising a pair of shortable spaced terminals in an electrical path between each said die and said common conductor.

23. An apparatus of claim 22 wherein a first one of said spaced terminals is provided on a said die and a second one of said terminals is provided off said die.

24. An apparatus of claim 23 wherein said second one of said terminals is provided in a street area of said wafer.

25. A die test apparatus comprising:
   a first die;
   a common signal line coupled to said first die, said common signal line being adapted to apply a signal in common to a plurality of second dice on a wafer; and
   a temporary isolation device provided between said common signal line and said first die, said temporary isolation device being adapted to selectively connect and disconnect said first die from said common signal line.

26. An apparatus of claim 25 wherein said temporary isolation device is a unidirectional current device.

27. An apparatus of claim 26 wherein said temporary isolation device is a diode.

28. An apparatus of claim 26 wherein said temporary isolation device is a transistor.

29. An apparatus of claim 28 wherein said transistor is connected as a diode.

30. An apparatus of claim 28 wherein said transistor is connected to be controlled by an applied signal.

31. An apparatus of claim 25 wherein said common signal line supplies a power supply signal to said first die and said second dice.

32. An apparatus of claim 25 wherein said common signal line is provided on said wafer.

33. An apparatus of claim 25 further comprising an external interface for testing said first die and wherein said common signal line is coupled to said external interface.

34. An apparatus of claim 33 wherein said temporary isolation device is provided at an external interface for testing said first die.

35. An apparatus of claim 33 further comprising a permanent isolation device provided in series with said temporary isolation device, said permanent isolation device adapted to allow permanent isolation between said common signal line and said first die.

36. An apparatus of claim 35, wherein said permanent isolation device is provided at an external interface for testing said plurality of dies.

37. An apparatus of claim 25 wherein said temporary isolation device is provided on said wafer adjacent to said die.

38. An apparatus of claim 25 wherein said temporary isolation device is provided on said wafer.

39. An apparatus of claim 25 wherein said temporary isolation device is provided in a street area of said wafer.

40. An apparatus of claim 25 wherein said temporary isolation device is provided on said first die.

41. An apparatus of claim 25, further comprising a permanent isolation device provided in series with said temporary isolation device, said permanent isolation device being adapted to selectively allow for permanent isolation of said common signal line from said first die.

42. An apparatus of claim 41, wherein said permanent isolation device comprises a fuse.

43. An apparatus of claim 41, wherein said permanent isolation device is provided off said first die.

44. An apparatus of claim 41, wherein said permanent isolation device is provided in a street area of said wafer.

45. An apparatus of claim 25 further comprising a pair of shortable spaced terminals in an electrical path between said first die and said common signal line.

46. An apparatus of claim 45 wherein a first one of said spaced terminals is provided on said first die and a second one of said terminals is provided off said first die.

47. An apparatus of claim 46 wherein said second one of said terminals is provided in a street area of said wafer.

* * * * *